(12) United States Patent
Nakura et al.

(10) Patent No.: US 6,565,268 B2
(45) Date of Patent: May 20, 2003

(54) OPTICAL CONNECTOR AND STRUCTURE OF OPTICAL CONNECTOR-PACKAGING/MOUNTING PORTION

(75) Inventors: Yuji Nakura, Nagoya (JP); Hitoshi Imazu, Nagoya (JP); Kazuhiro Asada, Nagoya (JP)

(73) Assignees: Autonetworks Technologies, Ltd., Nagoya (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/043,182

(22) Filed: Jan. 14, 2002

(65) Prior Publication Data

US 2002/0102075 A1 Aug. 1, 2002

(30) Foreign Application Priority Data

Jan. 26, 2001 (JP) ........................................ 2001-018673

(51) Int. Cl.[7] ................................................. G02B 6/42
(52) U.S. Cl. .......................................... 385/94; 385/89
(58) Field of Search ...................................... 385/88–94

(56) References Cited

U.S. PATENT DOCUMENTS

| 5,548,677 A | | 8/1996 | Kakii et al. .................... 385/92 |
| 5,838,703 A | * | 11/1998 | Lebby et al. .................. 372/43 |
| 6,302,596 B1 | * | 10/2001 | Cohen et al. .................. 385/93 |
| 6,422,766 B1 | * | 7/2002 | Althaus et al. ............... 385/94 |

FOREIGN PATENT DOCUMENTS

| JP | 6-29676 | 2/1994 |
| JP | 11-052193 | 2/1999 |

* cited by examiner

*Primary Examiner*—Akm E. Ullah
*Assistant Examiner*—Jerry T Rahll
(74) *Attorney, Agent, or Firm*—Oliff & Berridge, PLC

(57) ABSTRACT

In an optical connector, a shield casing 20, having element body portions 1a of optical elements 1 received therein, is received in a connector housing member 11 in such a manner that this shield casing can be contacted with a packaging surface of a packaging board Q.

9 Claims, 5 Drawing Sheets

OPTICAL CONNECTOR AND STRUCTURE OF OPTICAL CONNECTOR-PACKAGING/MOUNTING PORTION

BACKGROUND OF THE INVENTION

1. Field of the Invention

This invention relates to an optical connector and the structure of an optical connector-packaging/mounting portion used in the field of optical communication such as an OA, an FA and equipments mounted on a car.

2. Description of the Related Art

In the type of optical connector to be fixedly mounted on a packaging board, with an optical element contained therein, there has heretofore been adopted a construction in which the optical element is received in a shield casing of metal for noise protection purposes, and this casing is received in a housing made of a resin.

In the above conventional optical connector, however, a small gap existed between the shield casing and a packaging surface of the packaging board, and therefore there was a possibility that noises intruded to the optical element from the exterior through this gap. This problem becomes conspicuous particularly in a higher-frequency operation.

And besides, the optical element, which is a heat-generating element, is mounted within the resin-molded housing, and therefore heat, generated by the optical element, can not be efficiently radiated to the exterior, and the temperature of the optical element rises, so that a use environment temperature condition becomes severe.

SUMMARY OF THE INVENTION

Therefore, a first object of this invention is to provide an optical connector and a structure of an optical connector-packaging/mounting portion which are excellent in noise resistance, and a second object is to provide an optical connector and the structure of an optical connector-packaging/mounting portion which are excellent in heat-radiating ability.

In order to achieve the first object, according to a first aspect of the invention, there is provided an optical connector for being mounted on and fixed to a packaging board, which optical connector comprises a shield casing made of an electrically-conductive material, an element body portion of an optical element being able to be inserted into the shield casing through an opening, formed in a bottom thereof, to be received therein; and a connector housing member which can be mounted on and fixed to the packaging board; wherein the shield casing is received in the connector housing member in such a manner that when the connector housing member is mounted on and fixed to the packaging board, at least a peripheral edge portion of the opening, formed in the bottom of the shield casing, can be contacted with a packaging surface of the packaging board.

In order to achieve the second object, according to a second aspect of the invention, the shield casing may include a radiating portion which is exposed to the exterior of the connector housing member so as to radiate heat, generated by the optical element, to the exterior.

According to a third aspect of the invention, there may be provided shield casing-side screw-fastening piece portions which are formed on and project from the shield casing, and can be screw-fastened to the packaging board in such a manner that the screw-fastening piece portions are held in contact with a grounding-purpose wiring pattern formed on the packaging surface of the packaging board.

According to a fourth aspect of the invention, there may be provided housing-side screw-fastening piece portions which are formed on and project from the connector housing member, and can be screw-fastened, together with the shield casing-side screw-fastening piece portions, to the packaging board in superposed relation to the respective shield casing-side screw-fastening piece portions.

According to a fifth aspect of the invention, the shield casing may have a soldering surface which can be soldered to the grounding-purpose wiring pattern, formed on the packaging surface of the packaging board, when the connector housing member is mounted on and fixed to the packaging board.

According to a sixth aspect of the invention, there is provided a structure of an optical connector-packaging/mounting portion, which comprises an optical connector comprising a shield casing made of an electrically-conductive material, an element body portion of an optical element being able to be inserted into the shield casing through an opening, formed in a bottom thereof, to be received therein; and a connector housing member in which the shield casing is received in such a manner that a bottom of the connector housing is exposed to the exterior; and a packaging board on which the optical connector is mounted on and fixed to; wherein the connector housing member is mounted on and fixed to the packaging board in such a manner that at least a peripheral edge portion of the opening, formed in the bottom of the shield casing, is contacted with a packaging surface of the packaging board.

According to a seventh aspect of the invention, a grounding-purpose wiring pattern may be formed on the packaging surface of the packaging board over an area including that portion thereof with which the bottom of the shield casing is contacted when the optical connector is mounted on and fixed to the packaging board.

According to an eighth aspect of the invention, there may be provided shield casing-side screw-fastening piece portions which are formed on and project from the shield casing, and the shield casing-side screw-fastening piece portions are screw-fastened to the packaging board in such a manner that the screw-fastening piece portions are held in contact with the grounding-purpose wiring pattern formed on the packaging surface of the packaging board.

According to a ninth aspect of the invention, the shield casing may be soldered to the grounding-purpose wiring pattern formed on the packaging surface of the packaging board.

DETAILED DESCRIPTION OF THE PREFERRED EMBODIMENTS

A description will be given in more detail of preferred embodiments of the invention with reference to the accompanying drawings.

First Embodiment

Figure 1:
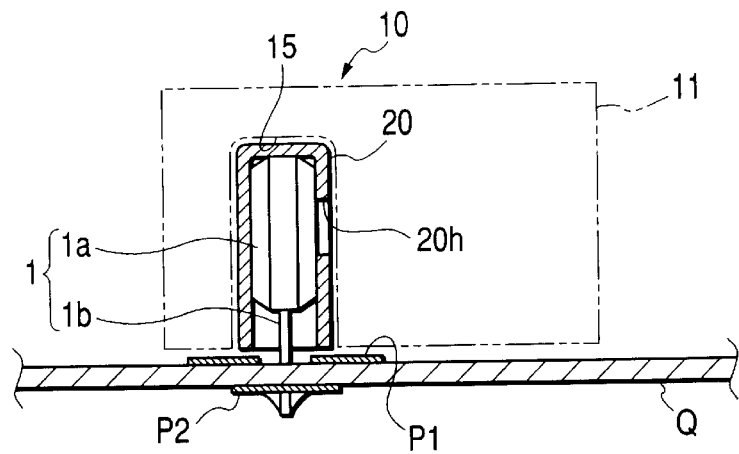
FIG. 1 is an explanatory view showing a condition in which a first embodiment of an optical connector of this invention is mounted on and fixed to a packaging board.
Figure 2:
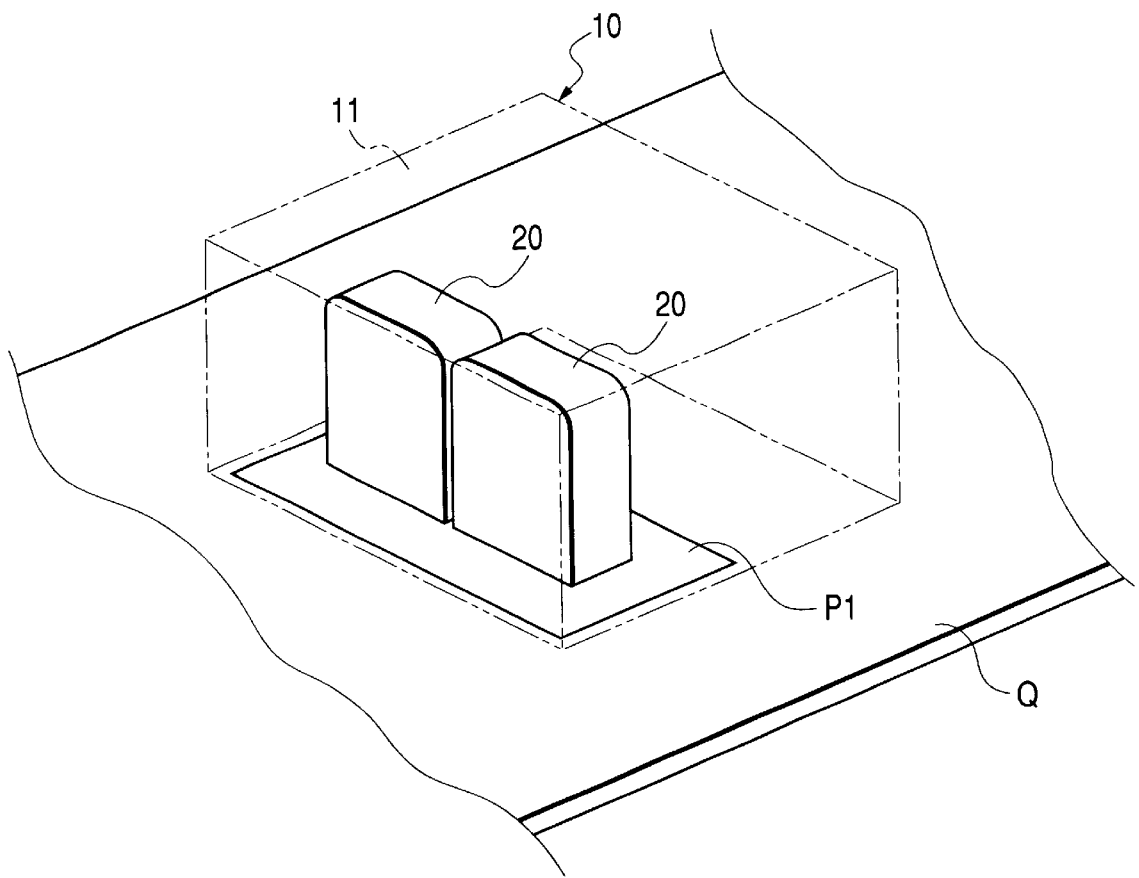
FIG. 2 is an explanatory view showing the condition in which the above optical connector is mounted on and fixed to the packaging board.

An optical connector and a structure of an optical connector-packaging/mounting portion, provided according to a first embodiment of this invention, will now be described with reference to FIGS. 1 and 2.

Although this first embodiment and a second embodiment (described later) will be described as directed to the two-pole type containing a pair of optical elements 1 (light-emitting elements or light-receiving elements), the invention can be similarly applied to the one-pole type, containing only one optical element 1, or three- or more pole type containing three or more optical elements 1.

This optical connector 10 is mounted on and fixed to a packaging board Q, and comprises shield casings 20 and a connector housing member 11.

The shield casing 20 is formed, for example, by blanking and bending a sheet of an electrically-conductive material such as a metal material such for example as brass, phosphor bronze, stainless steel and German silver (nickel silver). An element body portion 1a of the optical element 1 (light-emitting element or light-receiving element) can be inserted and received in this shield casing through an opening formed in the bottom thereof. In this embodiment, the shield casing 20 is formed into a generally box-shape having the open bottom.

When the element body portion 1a is inserted into the shield casing 20 through the bottom-side opening thereof, the element body portion 1a is received and held in this shield casing in such a manner that the whole of this element body portion is covered with the shield casing.

A window portion 20h is formed in the front side of the shield casing 20, and when the element body portion 1a is received and held in the shield casing 20 as described above, a light-emitting surface or a light-receiving surface, provided on a front surface of the element body portion 1a, is exposed to the exterior of the shield casing 20 through this window portion 20h.

This embodiment is directed to the two-pole type optical connector containing the pair of optical elements 1, and therefore there are used two shield casings 20.

The connector housing member 11 can be mounted on and fixed to the packaging board Q, and the shield casings 2 can be received in this connector housing member in such a manner that when this connector housing member is mounted on and fixed to the packaging board Q, a peripheral edge portion of the opening, formed in the bottom of each shield casing 2, can contact a packaging surface of the packaging board Q.

In this embodiment, the connector housing member 11 is a resin-molded product, and casing-receiving recesses 15, which can receive the shield casings 2, respectively, are formed in this connector housing member.

Each casing-receiving recess 15 has an internal shape corresponding to the external shape of the shield casing 20, and is open to the bottom surface of the connector housing member 11. When each shield casing 20 is inserted into the corresponding casing-receiving recess 15 through the bottom-side opening, the shield casing 20 is received and held in the casing-receiving recess 15, with its upper surface abutted against an upper inner surface of the casing-receiving recess 15.

At this time, the bottom of each shield casing 20 is exposed to the exterior from the bottom surface of the connector housing member 11, and when the connector housing member 11 is mounted on and fixed to the packaging board Q in such a manner that the bottom surface of the connector housing member 11 is laid over the predetermined packaging surface of the packaging board Q, the bottom surface of each shield casing 20 is pressed against the packaging surface of the packaging board Q. The connector housing member 11 is mounted on and fixed to the packaging board Q by fixing means such as means, using screws (see the second embodiment described later), or bonding means using an adhesive.

This optical connector 10 is so constructed that a mating optical connector (not shown) can be connected thereto, and when the mating optical connector is connected to it, end portions of optical fibers, held in this mating optical connector, are guided respectively toward the light-emitting surfaces or the light-receiving surfaces of the element body portions 1a, and the optical fibers are optically connected to the optical elements, respectively (see the second embodiment described later).

The shield casings 20 are inserted into the connector housing member 11, and this optical connector 10 of the above construction is mounted to and fixed to the packaging surface of the packaging board Q in such a posture that the peripheral edge portion of the opening in the bottom of each shield casing 20 is contacted with the packaging surface of the packaging board Q. Lead portions 1b of each optical element 1 extend respectively through through-holes, formed through the packaging board Q, and project from a reverse surface of this board, and are soldered to a predetermined wiring pattern P2 formed on this reverse surface.

A wiring pattern P1 for grounding purposes is formed on the packaging surface of the packaging board Q over an area including those portions thereof with which the bottoms of the shield casings 20 are contacted when the optical connector 10 is mounted on and fixed to the packaging surface. When the optical connector 10 is mounted on and fixed to the packaging board Q as described above, the bottoms of the shield casings 20 are contacted with the wiring pattern P1, thereby grounding the shield casings 20.

In the optical connector 10 of this construction and the structure of the packaging/mounting portion for the optical connector 10, the shield casings 20 are received in the connector housing member 11 in such a manner that when this connector housing member is mounted on and fixed to the packaging board Q, the peripheral edge portion of the opening, formed in the bottom of each shield casing 20, can be contacted with the packaging surface of the packaging board Q. Therefore, noises, which intrude into each optical element 1 from the exterior through a gap between the shield casing 20 and the packaging board Q, are prevented, and therefore the noise resistance is excellent.

The wiring pattern P1 for grounding purposes is formed on the packaging surface of the packaging board Q over the area including those portions thereof with which the bottoms of the shield casings 20 are contacted when the optical connector 10 is mounted on and fixed to the packaging surface. With this construction, when the optical connector 10 is mounted on and fixed to the packaging board Q, the shield casings 20 contact the grounding-purpose wiring pattern P1, and therefore are grounded, and this is convenient.

Figure 3:
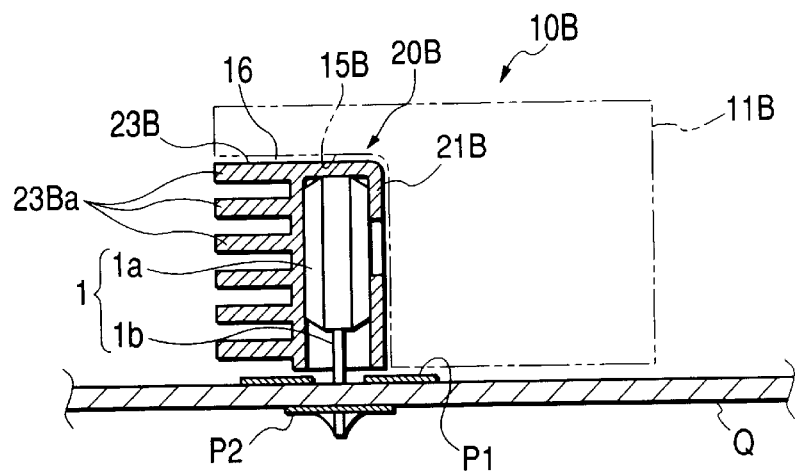
FIG. 3 is an explanatory view showing a condition in which a modified example of the above optical connector is mounted on and fixed to the packaging board.
Figure 4:
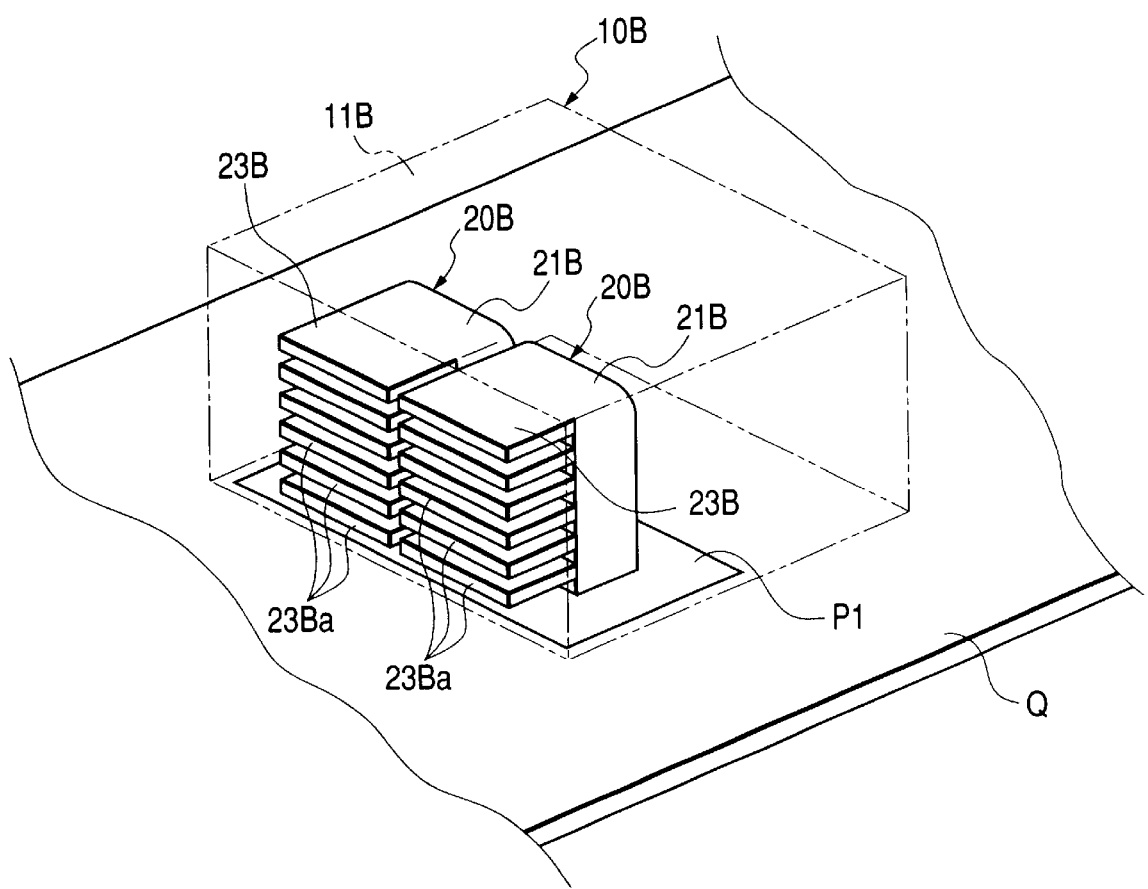
FIG. 4 is an explanatory view showing a condition in which the modified example of the above optical connector is mounted on and fixed to the packaging board.

As in a modified optical connector 10B shown in FIGS. 3 and 4, there may be provided a construction in which each of shield casings 20B has a radiating portion 23B which is exposed to the exterior of a connector housing member 11B so as to radiate heat, generated by an optical element 1, to the exterior.

More specifically, in this optical connector 10B, the radiating portion 23B, having a plurality of outwardly-projecting radiating projections 23Ba, is formed on a rear side of a casing body portion 21B similar in construction to the shield casing 20 of the above first embodiment. The connector housing member 11B has an opening 16 formed at a rear side of each casing-receiving recess 15B, and the radiating portion 23B is exposed to the exterior of the connector housing member 11B through this opening 16.

The radiating projections 23Ba have the function of increasing the surface area of that portion of the shield casing 20B, exposed to the exterior of the connector housing member 11B, thereby enhancing the radiating effect thereof. Examples, achieving the high radiating effect, includes a construction, in which a plurality of radiating projections 23Ba each in the form of a fin are projected in a parallel, closely-spaced manner as shown in FIGS. 3 and 4, and a construction in which a plurality of radiating projections 23Ba each in the form of a pillar are projected much like a forest.

In this modified optical connector 10B, heat, generated by the element body portion 1a, transfers to the radiating portion 23B of the shield casing 20B, and is radiated to the exterior from the exposed portion thereof, and therefore the radiating ability for the optical element 1 is excellent.

In this modified example, the casing body portion 21B may be separate from the radiating portion 23B. In this case, the radiating portion 23B is mounted in the connector housing member 11B in such a manner that this radiating portion 23B is contacted with the casing body portion 21B, and with this arrangement heat, generated by the element body portion 1a, transfers from the casing body portion 21B to the radiating portion 23B through the area of contact between the casing body portion 21B and the radiating portion 23B, and is radiated to the exterior. Therefore, similarly, the radiating ability for the optical element 1 is excellent.

In the above first embodiment, a rear portion of the shield casing 20 may be formed into a radiating portion which is directly exposed to the exterior of the housing body member 11.

Second Embodiment

Next, an optical connector 10C and a structure of a packaging/mounting portion for the optical connector 10C, provided according to the second embodiment of this invention, will now be described with reference to FIGS. 5 to 8.

Figure 5:
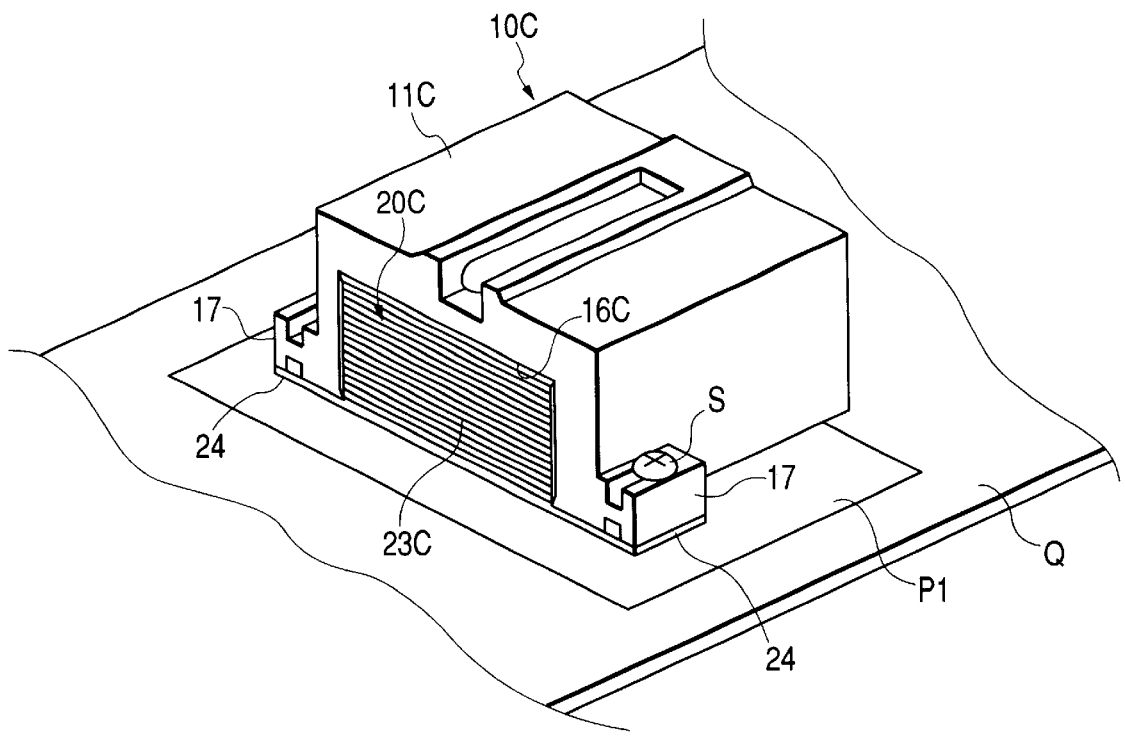
FIG. 5 is a perspective view showing a condition in which a second embodiment of an optical connector of the invention is mounted on and fixed to a packaging board.
Figure 6:
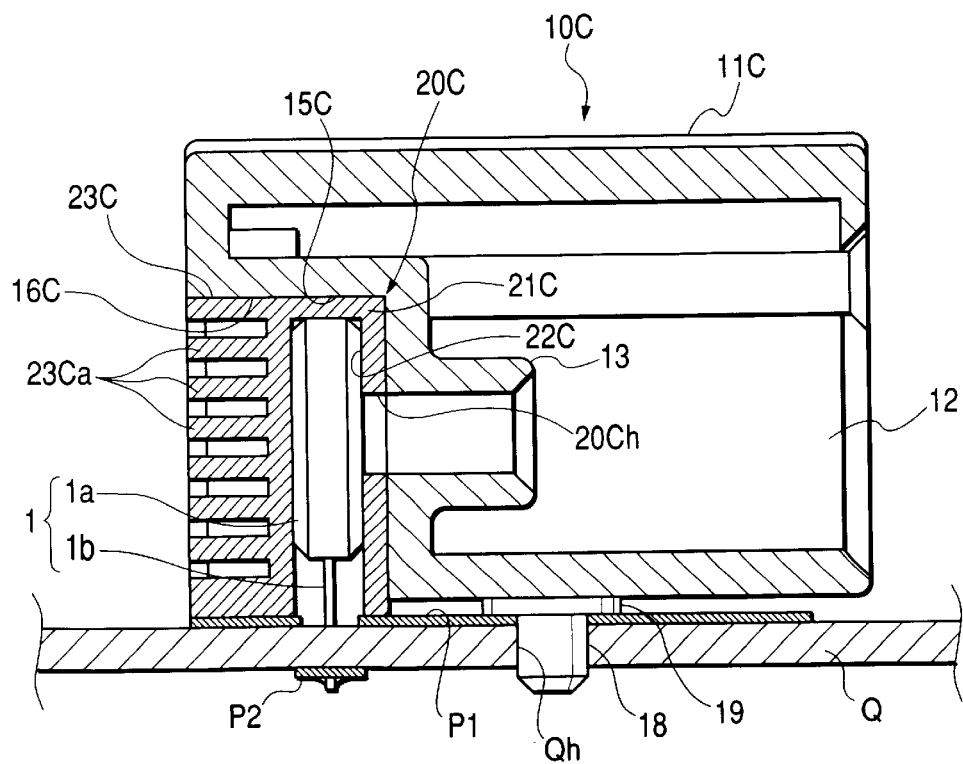
FIG. 6 is a cross-sectional view showing the condition in which the above optical connector is mounted on and fixed to the packaging board.

As shown in FIGS. 5 to 7, the optical connector 10C is mounted on and fixed to a packaging board Q, and comprises a shield casing 20C, and a connector housing member 11C.

As shown in FIGS. 5 to 8, the shield casing 20C is formed, for example, by blanking and bending a sheet of an electrically-conductive material such as a metal material such for example as brass, phosphor bronze, stainless steel and German silver (nickel silver). An element body portion 1a of each optical element 1 can be inserted and received in this shield casing at least through an opening formed in the bottom thereof.

More specifically, the shield casing 20C includes a casing body portion 21C for receiving the element body portions 1a, and a radiating portion 23C formed integrally on a rear side of this casing body portion 21C.

A pair of element-receiving recesses 22C are formed in the casing body portion 21C, and are juxtaposed to each other in a direction of the width thereof, and each of the element-receiving recesses 22C is open to the bottom surface of the casing body portion 21C. When the element body portions 1a are inserted into the casing body portion 21C through the respective bottom-side openings, each element body portion 1a is received and held in the casing body portion 21C in such a manner that the whole of the element body portion is covered with the casing body portion.

A pair of window portions 20Ch are formed in the front side of the casing body portion 21C, and when the pair of element body portions 1a are received and held in the casing body portion 21C as described above, light-emitting surfaces or light-receiving surfaces, provided respectively on front surfaces of the element body portions 1a, are exposed to the exterior through the respective window portions 20Ch.

The radiating portion 23C is a constituent element which is exposed to the exterior of the connector housing member 11C so as to radiate heat, generated by the optical elements 1, to the exterior. This radiating portion has a plurality of radiating projections 23Ca projecting toward the rear side of the shield casing 20C.

As described above for the modified example of the first embodiment, each radiating projection 23Ca can have a fin-shape or a pillar shape.

Shield casing-side screw-fastening piece portions 24 are formed on and project from the shield casing 20C, and can be fixedly secured to the packaging board Q by screws in such a manner that the bottom of this shield casing is held in press-contact with a grounding-purpose wiring pattern P1 (described later).

In this embodiment, the pair of shield casing-side screw-fastening piece portions 24 are formed respectively on the opposite side surfaces of the shield casing 20C at a lower portion thereof, and extend outwardly.

Each shield casing-side screw-fastening piece portion 24 has a generally-rectangular plate-shape, and has a screw passage hole 24h. The bottom surface of each shield casing-side screw-fastening piece portion 24 is flush with the bottom surface of the casing body portion 21C of the shield casing 20C, and when the shield casing-side screw-fastening piece portions 24 are fixedly secured to the packaging board Q by the screws as described later in such a manner that the bottom surfaces of the shield casing-side screw-fastening piece portions 24 (including peripheral edge portions of the openings) are contacted with the packaging board Q, the bottom surface of the casing body portion 21C is also held in press-contact with the grounding-purpose wiring pattern P1 formed on the packaging board Q.

The connector housing member 11C can be mounted on and fixed to the packaging board Q, and the shield casing 20C can be received in the connector housing member 11C in such a manner that when this connector housing member is mounted on and fixed to the packaging board Q, at least the bottom of the shield casing 20C can be contacted with the grounding-purpose wiring pattern P1 formed on the packaging board Q.

More specifically, the connector housing member 11C is a resin-molded product, and as a whole it is in the form of a generally square tubular member flattened in the widthwise direction, and the interior of this connector housing member is partitioned by a partition wall portion 12 provided at a widthwise-central portion thereof. Tubular ferrule guide portions 13 are formed respectively at axially-central portions of a pair of tubular internal spaces formed by this partition, and a casing-receiving recess 15C for receiving and holding the shield casing 20C is formed at the rear side of the ferrule guide portions 13.

The casing-receiving recess 15C has an internal shape corresponding to the external shape of the casing body portion 21C of the shield casing 20C, and is open to the bottom surface and rear side of the connector housing member 11C. When the casing body portion 21C of the shield casing 20C is inserted into the casing-receiving recess 15C through the bottom-side opening, the casing body portion 21C is received and held in the casing-receiving recess 15C, with its upper surface abutted against an upper inner surface of the casing-receiving recess 15C.

At this time, the radiating portion 23C, provided at the rear side of the casing body portion 21C, is received in a radiating portion-receiving opening 16C, formed at the rear side of the casing-receiving recess 15C, and is exposed to the rear side of the connector housing member 11C.

When the shield casing 20C is thus received and held in the casing-receiving recess 15C, the light-emitting surfaces or the light-receiving surfaces of the pair of element body portions 1a, received in the shield casing 20C, are exposed respectively to the interiors of the ferrule guide portions 13 through the respective window portions 20Ch. When a mating optical connector (not shown) is connected to this optical connector 10C, a pair of ferrules of this mating optical connector are fitted respectively into the ferrule guide portions 13, and are guided respectively toward the rear sides of these ferrule guide portions, and as a result end surfaces of optical fibers, received and held respectively in the ferrules, are disposed in opposed relation respectively to the light-emitting surfaces or the light-receiving surfaces of the element body portions 1a disposed respectively at the rear sides of the ferrule guide portions 13, so that the optical fibers are optically coupled to the optical elements 1, respectively.

Lead portions 1b, which extend downwardly from each element body portion 1a, received in the shield casing 20C, when the shield casing 20C is received and held in the casing-receiving recess 15C, pass through the bottom-side opening in the shield casing 20, and extend downwardly of the connector housing member 11C. When this optical connector 10C is mounted on and fixed to the packaging board Q, the lead portions 1b are electrically connected to a predetermined wiring pattern P2, formed on the reverse surface of the packaging board Q, by soldering or the like.

Figure 7A:
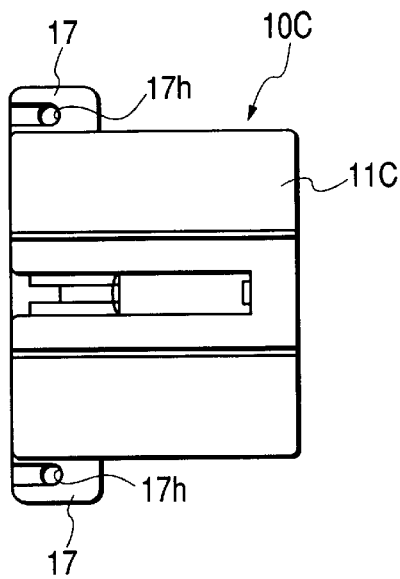
FIG. 7A is a plan view of the above optical connector.
Figure 7B:
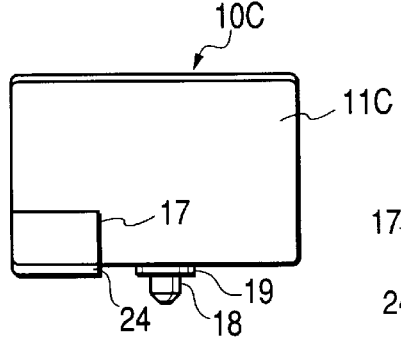
FIG. 7B is a side-elevational view of this optical connector.
Figure 7D:
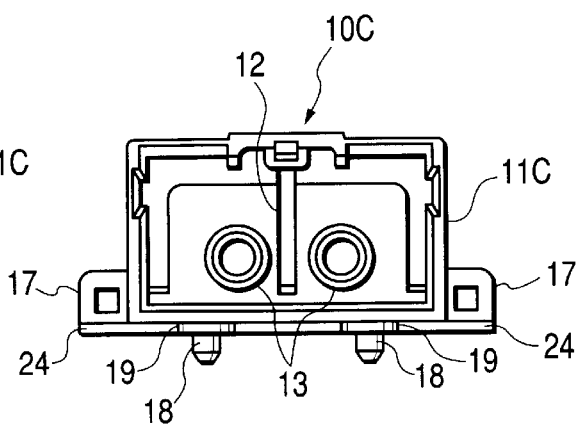
FIG. 7D is a front-elevational view of this optical connector.
Figure 7C:
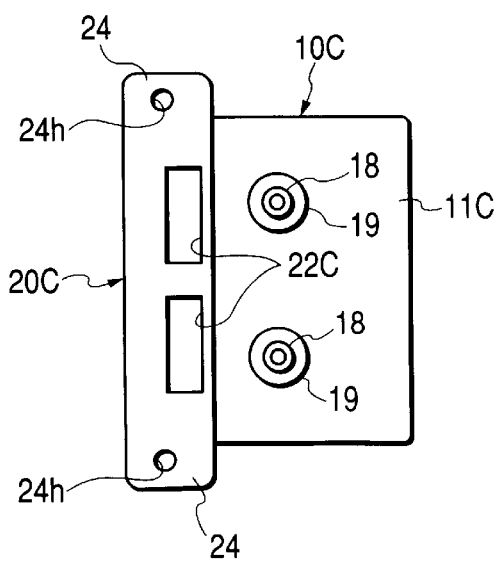
FIG. 7C is a bottom view of this optical connector.
Figure 7E:
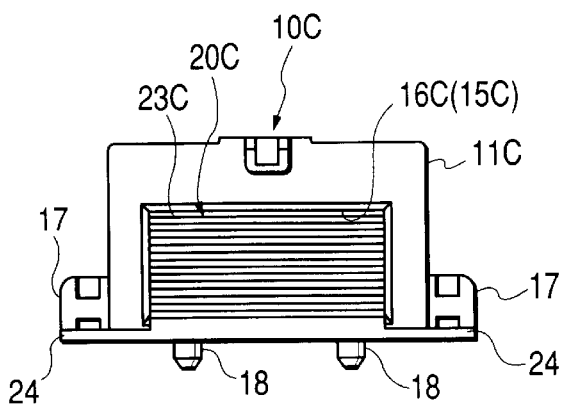
FIG. 7E is a rear view of this optical connector.
Figure 8:
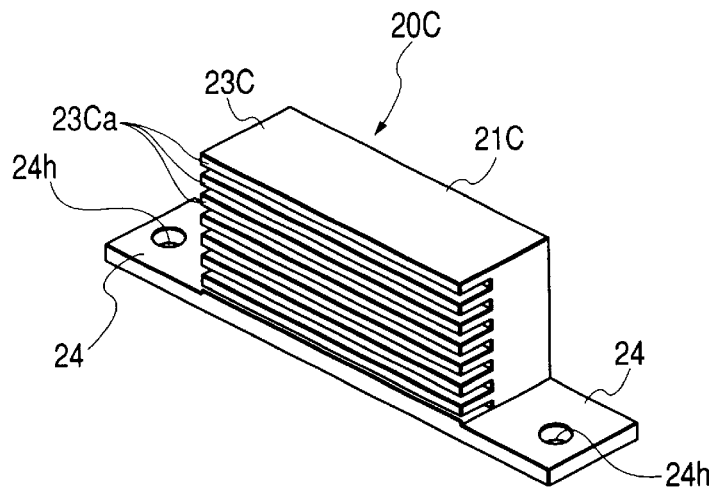
FIG. 8 is a perspective view showing a shield casing.

When the shield casing 20C is received and held in the casing-receiving recess 15C, the bottom of the shield casing 20C is exposed and projected a predetermined small amount from the bottom surface of the connector housing member 11C (see FIGS. 6 and 7B). Namely, the height dimension of the shield casing 20C is larger by the predetermined small amount than the depth dimension of the casing-receiving recess 15C between the upper and lower ends thereof, and when the shield casing 20C is inserted into the casing-receiving portion 15C until the upper surface of the shield casing 20C is brought into abutting engagement with the inner upper surface of the casing-receiving recess 15C, the bottom surface of the shield casing 20C projects the predetermined small amount from the bottom surface of the connector housing member 11C. With this construction, when the connector housing member 11C is mounted on and fixed to the packaging board Q in such a manner that the bottom surface of the connector housing member 11C is laid over a predetermined packaging surface of the packaging board Q, the bottom surface of the shield casing 20C is pressed against the packaging surface of the packaging board Q.

Housing-side screw-fastening piece portions 17 are formed on the connector housing member 11C, and can be superposed on the shield casing-side screw-fastening piece portions 24, respectively, and can be fixedly secured, together with these portions 24, to the packaging board Q by the screws.

In this embodiment, the pair of housing-side screw-fastening piece portions 17 are formed on the connector housing member 11 such that when the shield casing 20C is received in the connector housing member 11C, these screw-fastening piece portions 17 are superposed respectively on the pair of shield casing-side fixing piece portions 24 of the shield casing 20. Namely, these housing-side screw-fastening piece portions are formed respectively on the opposite side surfaces of the connector housing member 11C at a lower portion thereof, and extend outwardly.

A screw passage hole 17h is formed through each housing-side screw-fastening piece portion 17, and can communicate with the screw passage hole 24h in the corresponding shield casing-side screw-fastening piece portion 24. The shield casing 20C is inserted into the connector housing member 11C, and in this condition, when the pair of screws S are passed through the respective screw passage holes 17h in the housing-side screw-fastening piece portions 17 and the respective screw passage holes 24h in the shield casing-side screw-fastening piece portions 24, and are threaded respectively into screw holes (not shown) formed in the packaging board Q, the housing-side screw-fastening piece portions 17, are fixedly secured, together with the shield casing-side screw-fastening piece portions 24, to the packaging board Q by the screws, so that this optical connector 10C is mounted on and fixed to the packaging board Q.

In this embodiment, positioning projections 18 are formed on and project from the bottom surface of the connector housing member 11C, and when the connector housing member 11C is to be mounted on and fixed to the packaging board Q, these positioning projections 18 are press-fitted respectively into positioning holes Qh formed through the packaging board Q, thereby positioning the connector housing member 11C.

In this optical connector 10C, the bottom surface of the shield casing 20C projects the predetermined small amount from the bottom surface of the connector housing member 11C, and therefore when the connector housing member 11C is mounted on and fixed to the packaging board Q, a rear portion of the bottom surface of the connector housing member 11C is spaced the predetermined small amount from the packaging board Q. Therefore, a base portion 19, having a predetermined thickness corresponding to the predetermined small amount, is formed on a proximal end portion of each positioning projection 18 over an entire periphery thereof, and when the connector housing member 11C is mounted on and fixed to the packaging board Q, the base portions 19 are abutted against the packaging board Q, thereby holding the connector housing member 11C in a posture as parallel to the packaging board Q as possible.

The grounding-purpose wiring pattern P1 is formed by a copper foil or the like on the packaging surface of the packaging board Q over an area including that portion thereof with which the bottom of the shield casing 20C can be contacted when the optical connector 10C is mounted on and fixed to the packaging surface. This wiring pattern P1 is partially removed at those regions where the lead portions 1b of the optical elements 1 extend downwardly. The predetermined wiring pattern P2 is formed by a copper foil or the like on that surface (lower surface in FIG. 6) of the packaging board Q facing away from the packaging surface, and the lead portions 1b pass respectively through through-holes, and project downwardly from the packaging board Q, and can be electrically connected to the wiring pattern P2 by soldering or the like.

In the case where the wiring pattern P1 is formed over an area spreading somewhat beyond the outer periphery of the optical connector 10C, heat, generated by the optical elements 1, is transferred from the shield casing 20C to the wiring pattern P1, and can be easily radiated to the exterior from that portion of the wiring pattern P1 disposed outwardly beyond the outer periphery of the optical connector 11C, and therefore the good radiating ability for the optical elements 1 can be obtained.

In the optical connector 10C of this construction, the shield casing 20C is inserted into the connector housing member 11C, and the bottom of the shield casing 20C, projecting from the bottom surface of the connector housing member 11C, is contacted with the grounding-purpose wiring pattern P1, and the positioning projections 18 are press-fitted respectively into the positioning holes Qh, with their base portions 19 abutted against the packaging board Q, and in this condition the housing-side screw-fastening piece portions 17 and the shield casing-side screw-fastening piece portions 24 are fixedly secured to the packaging board Q by the screws S, so that the optical connector 10C is mounted on and fixed to the packaging board Q. The lead portions 1b of the optical elements 1 are electrically connected to the wiring pattern P2 by soldering or the like.

In the optical connector 10C of this construction and the structure of the packaging/mounting portion for the optical connector 10C, the shield casing 20C is received in the connector housing member 11C in such a manner that when this connector housing member 11C is mounted on and fixed to the packaging board Q, the bottom of the shield casing 20C (including the peripheral edge portions of the openings) can be contacted with the grounding-purpose wiring pattern P1 formed on the packaging surface of the packaging board Q. Therefore, noises, which intrude into each optical element 1 from the exterior through a gap between the shield casing 20C and the packaging board Q, are prevented, and therefore the noise resistance is excellent.

And besides, the shield casing 20C has the radiating portion 23C which is exposed to the exterior to the connector housing member 11C so as to radiate heat, generated by the optical elements 1, to the exterior, and with this construction heat, generated by the optical elements 1, is radiated to the exterior through the radiating portion 23C, thereby achieving an advantage that the radiating ability for the optical elements 1 is excellent.

The excellent noise resistance and radiating ability for the optical elements 1 are thus obtained, and as a result the restrictions, imposed when operating the optical elements at high speed, are reduced, so that the optical elements can be operated at higher speed.

The shield casing-side screw-fastening piece portions 24 are formed on and project from the shield casing 20C, and these portions 24 can be screw-fastened to the packaging board Q, with the bottom of the shield casing held in press-contact with the grounding-purpose wiring pattern P1. Therefore, by screw-fastening the shield casing-side screw-fastening piece portions 24 to the packaging board Q, the shield casing 20C can be contacted with the grounding-purpose wiring pattern P1, and therefore can be grounded more positively and easily.

In this second embodiment, although the housing-side screw-fastening piece portions 17 are formed on the connector housing member 11C, these are not always necessary. However, in the case where the housing-side screw fastening piece portions 17 are formed on the connector housing member 11C, and can be screw-fastened, together with the shield casing-side screw-fastening piece portions 24, to the packaging board Q in superposed relation to the respective piece portions 24, the positive and easy grounding of the shield casing 20C to the grounding-purpose wiring pattern P1 and the fixing of the connector housing member 11C to the packaging board Q can be effected simultaneously, and therefore the mounting and fixing of the optical connector 10C can be easily effected.

Figure 9:
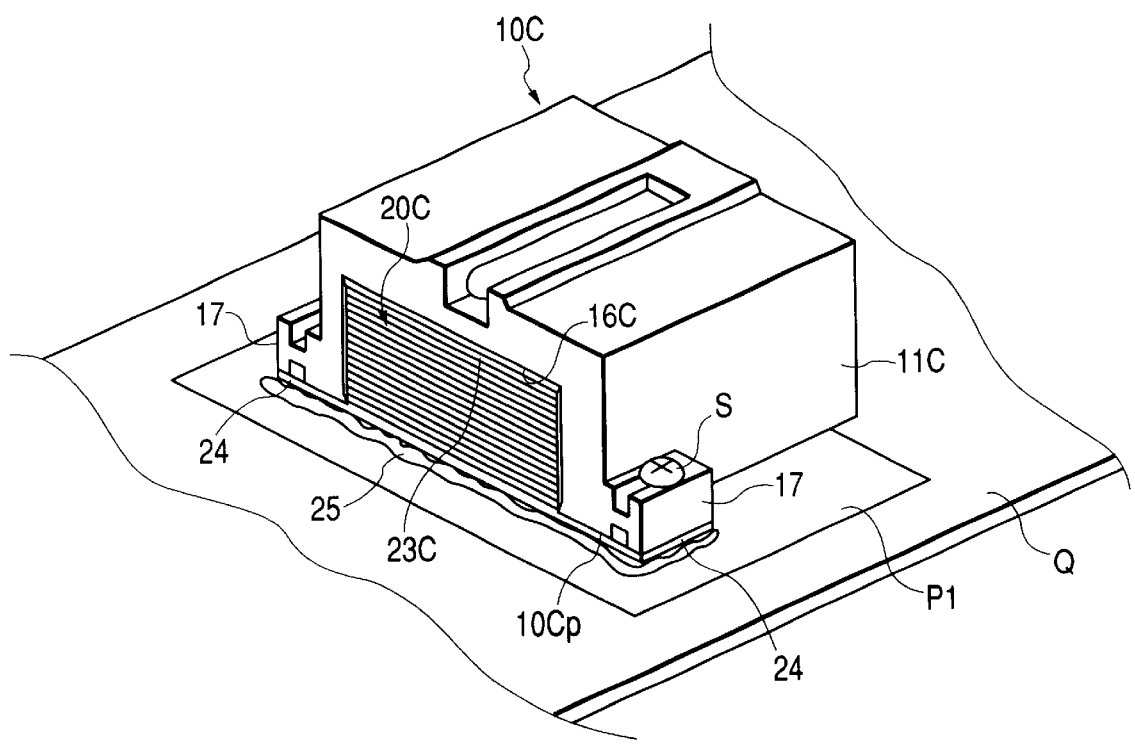
FIG. 9 is a cross-sectional view showing a condition in which a modified optical connector is mounted on and fixed to the packaging board.

As in a modified example shown in FIG. 9, the bottom surface of the shield casing 20C may be formed into a soldering surface 10Cp which can be soldered to the grounding-purpose wiring pattern P1, formed on the packaging surface of the packaging board Q, when the connector housing member 10C is mounted on and fixed to the packaging board Q, and the soldering surface 10Cp of the shield casing 20C is adapted to be soldered to the grounding-purpose wiring pattern P1 by solder 25.

The shield casing 20C is thus soldered to the grounding-purpose wiring pattern P1, and therefore the grounding of the shield casing 20C can be effected more positively.

In this case, even if the shield casing-side screw-fastening piece portions 24 are screw-fastened to the packaging board Q in such a manner that these portions 24 are not contacted with the grounding-purpose wiring pattern P1, the positive grounding can be effected.

As described above, in the optical connector according to the first aspect of the invention, the shield casing is received in the connector housing member in such a manner that when the connector housing member is mounted on and fixed to the packaging board, at least the peripheral edge portion of the opening, formed in the bottom of the shield casing, can be contacted with the packaging surface of the packaging board. Therefore, noises, which intrude into the optical element from the exterior through the gap between the shield casing and the packaging board, are prevented, and the noise resistance is excellent, and the first object of the invention is achieved.

According to the second aspect of the invention, the shield casing includes the radiating portion which is exposed to the exterior of the connector housing member so as to radiate heat, generated by the optical element, to the exterior, and therefore heat, generated by the optical element, is radiated to the exterior through the radiating portion, and therefore the radiating ability for the optical element is excellent, and the second object is achieved.

According to the third aspect of the invention, the shield casing-side screw-fastening piece portions are formed on and project from the shield casing, and can be screw-fastened to the packaging board in such a manner that the screw-fastening piece portions are held in contact with the grounding-purpose wiring pattern formed on the packaging surface of the packaging board. Therefore, the shield casing can be grounded easily and positively.

According to a fourth aspect of the invention, the housing-side screw-fastening piece portions are formed on and project from the connector housing member, and can be screw-fastened, together with the shield casing-side screw-fastening piece portions, to the packaging board in superposed relation to the respective shield casing-side screw-fastening piece portions. Therefore, when the housing-side screw fastening piece portions are screw-fastened, together with the shield casing-side screw-fastening piece portions, to the packaging board in a superposed manner, the positive and easy grounding of the shield casing to the grounding-purpose wiring pattern and the fixing of the connector housing member to the packaging board can be effected simultaneously, and therefore the mounting and fixing of the optical connector can be easily effected.

According to a fifth aspect of the invention, the shield casing has the soldering surface which can be soldered to the grounding-purpose wiring pattern, formed on the packaging surface of the packaging board, when the connector housing member is mounted on and fixed to the packaging board. Therefore, by soldering this soldering portion to the grounding-purpose wiring pattern, the shield casing can be grounded positively and easily.

In the structure of the optical connector-packaging/mounting portion according to a sixth aspect of the invention, the connector housing member is mounted on and fixed to the packaging board in such a manner that at least the peripheral edge portion of the opening, formed in the bottom of the shield casing, is contacted with the packaging surface of the packaging board. Therefore, noises, which intrude into the optical element from the exterior through the gap between the shield casing and the packaging board, are prevented, and the noise resistance is excellent.

According to a seventh aspect of the invention, the grounding-purpose wiring pattern is formed on the packaging surface of the packaging board over an area including that portion thereof with which the bottom of the shield casing is contacted when the optical connector is mounted on and fixed to the packaging surface. Therefore, when the optical connector is mounted on and fixed to the packaging board, the shield casing is contacted with the grounding-purpose wiring pattern, and therefore is grounded.

According to an eighth aspect of the invention, the shield casing-side screw-fastening piece portions are formed on and project from the shield casing, and these shield casing-side screw-fastening piece portions are screw-fastened to the packaging board in such a manner that the screw-fastening piece portions are held in contact with the grounding-purpose wiring pattern formed on the packaging surface of the packaging board. Therefore, the grounding of the shield casing can be effected more positively and easily.

According to a ninth aspect of the invention, the shield casing is soldered to the grounding-purpose wiring pattern formed on the packaging surface of the packaging board. In this case, also, the grounding of the shield casing can be effected more positively and easily.

What is claimed is:

1. An optical connector for being mounted on and fixed to a packaging board, comprising:

a shield casing made of an electrically-conductive material, an element body portion of an optical element being able to be inserted into said shield casing through an opening, formed in a bottom thereof, to be received therein; and a connector housing member which can be mounted on and fixed to said packaging board;

wherein said shield casing is received in said connector housing member in such a manner that when said connector housing member is mounted on and fixed to said packaging board, at least a peripheral edge portion of said opening, formed in the bottom of said shield casing, can be contacted with a packaging surface of said packaging board.

2. An optical connector according to claim 1, in which said shield casing includes a radiating portion which is exposed to the exterior of said connector housing member so as to radiate heat, generated by said optical element, to the exterior.

3. An optical connector according to claim 1, in which shield casing-side screw-fastening piece portions are formed on and project from said shield casing, and can be screw-fastened to said packaging board in such a manner that said screw-fastening piece portions are held in contact with a grounding-purpose wiring pattern formed on the packaging surface of said packaging board.

4. An optical connector according to claim 3, in which housing-side screw-fastening piece portions are formed on and project from said connector housing member, and can be screw-fastened, together with said shield casing-side screw-fastening piece portions, to said packaging board in superposed relation to the respective shield casing-side screw-fastening piece portions.

5. An optical connector according to claim 1, in which said shield casing has a soldering surface which can be soldered to the grounding-purpose wiring pattern, formed on the packaging surface of said packaging board, when said connector housing member is mounted on and fixed to said packaging board.

6. A structure of an optical connector-packaging/mounting portion comprising:

an optical connector comprising a shield casing made of an electrically-conductive material, an element body portion of an optical element being able to be inserted into said shield casing through an opening, formed in a bottom thereof, to be received therein; and a connector housing member in which said shield casing is received in such a manner that a bottom of said shield casing is exposed to the exterior; and a packaging board on which said optical connector is mounted on and fixed to;

wherein said connector housing member is mounted on and fixed to said packaging board in such a manner that at least a peripheral edge portion of said opening, formed in the bottom of said shield casing, is contacted with a packaging surface of said packaging board.

7. A structure of an optical connector-packaging/mounting portion according to claim 6, in which a grounding-purpose wiring pattern is formed on the packaging surface of said packaging board over an area including that portion thereof with which the bottom of said shield casing is contacted when said optical connector is mounted on and fixed to said packaging board.

8. A structure of an optical connector-packaging/mounting portion according to claim 6, in which shield casing-side screw-fastening piece portions are formed on and project from said shield casing, and said shield casing-side screw-fastening piece portions are screw-fastened to said packaging board in such a manner that said screw-fastening piece portions are held in contact with the grounding-purpose wiring pattern formed on the packaging surface of said packaging board.

9. A structure of an optical connector-packaging/mounting portion according to claim 6, in which said shield casing is soldered to the grounding-purpose wiring pattern formed on the packaging surface of said packaging board.

* * * * *